(12) United States Patent
Osawa

(10) Patent No.: US 7,268,017 B2
(45) Date of Patent: Sep. 11, 2007

(54) MULTILAYERED STRUCTURE, MULTILAYERED STRUCTURE ARRAY AND METHOD OF MANUFACTURING THE SAME

(75) Inventor: Atsushi Osawa, Kaisei-machi (JP)

(73) Assignee: Fujifilm Corporation, Tokyo (JP)

( * ) Notice: Subject to any disclaimer, the term of this patent is extended or adjusted under 35 U.S.C. 154(b) by 143 days.

(21) Appl. No.: 11/219,647

(22) Filed: Sep. 7, 2005

(65) Prior Publication Data

US 2006/0076650 A1 Apr. 13, 2006

(30) Foreign Application Priority Data

Sep. 24, 2004 (JP) .............................. 2004-277970

(51) Int. Cl.
*H01L 21/00* (2006.01)
(52) U.S. Cl. ....................... 438/113; 438/458
(58) Field of Classification Search ................ 438/113, 438/458, 462
See application file for complete search history.

(56) References Cited

FOREIGN PATENT DOCUMENTS

JP 61-32835 B2 7/1986

*Primary Examiner*—Roy Potter
(74) *Attorney, Agent, or Firm*—Sughrue Mion, PLLC

(57) ABSTRACT

The productivity of a multilayered structure etc. is improved by easily forming insulating films for insulating internal electrode layers from side electrodes. The multilayered structure includes: a first internal electrode layer including a first conducting material extending to a first side surface of the multilayered structure and having magnetism at a predetermined temperature and a second conducting material extending to a second side surface of the multilayered structure and having no magnetism at the predetermined temperature; a dielectric layer formed on the first internal electrode layer; a second internal electrode layer including the second conducting material extending to the first side surface and the first conducting material extending to the second side surface; a first insulating film formed on the first internal electrode layer in the first side surface; and a second insulating film formed on the second internal electrode layer in the second side surface.

12 Claims, 12 Drawing Sheets

MULTILAYERED STRUCTURE, MULTILAYERED STRUCTURE ARRAY AND METHOD OF MANUFACTURING THE SAME

BACKGROUND OF THE INVENTION

1. Field of the Invention

The present invention relates to a multilayered structure in which insulating layers and electrode layers are alternately stacked, a multilayered structure array in which plural multilayered structures are arranged, and a method of manufacturing the multilayered structure or the multilayered structure array.

2. Description of a Related Art

Multilayered structures, in each of which insulating (dielectric) layers and electrode layers are alternately formed, are utilized not only for multilayered capacitors but also for various uses such as piezoelectric pumps, piezoelectric actuators, and ultrasonic transducers. In recent years, with the developments of MEMS (micro electro mechanical systems) related devices, elements each having such a multilayered structure have been microfabricated still further and packaged more densely.

In microfabrication of an element having opposed electrodes, since the smaller the area of the element is made, the smaller the capacity between the electrodes becomes, a problem that the electrical impedance of the element rises occurs. For example, when the electrical impedance rises in a piezoelectric actuator, the impedance matching can not be taken with a signal circuit for driving the piezoelectric actuator and power becomes difficult to be supplied, and thereby, the performance as the piezoelectric actuator is degraded. Alternatively, in an ultrasonic transducer using a piezoelectric element, oscillation intensity of ultrasonic wave is dropped. Accordingly, in order to enlarge the capacity between electrodes while microfabricating the element, plural piezoelectric material layers and plural electrode layers are alternatively stacked. This is because the capacity between electrodes of the entire element can be made larger by connecting the stacked plural layers in parallel.

In such a multilayered structure, in order to connect the plural internal electrode layers to one another, interconnection is performed on the side surfaces of the piezoelectric element. FIG. 11 is a sectional view for explanation of a general interconnection method of a multilayered structure. The multilayered structure 100 includes plural piezoelectric material layers 101, plural internal electrode layers 102 and 103, and two side electrodes 104 and 105. The internal electrode layers 102 are formed such that one end thereof may extend to one wall surface of the multilayered structure and connected to the side electrode 104 and insulated from the side electrode 105. Further, the internal electrode layers 103 are formed such that one end thereof may extend to the other wall surface of the multilayered structure and connected to the side electrode 105 and insulated from the side electrode 104. By applying a potential difference between the side electrode 104 and the side electrode 105, an electric field is applied to the piezoelectric material layers 101 disposed between the internal electrode layers 102 and the internal electrode layers 103, and the piezoelectric material layers 101 expand and contract by the piezoelectric effect.

By the way, in the layers in which the internal electrode layers 102 and 103 are disposed, insulating regions 106 in which no electrode is formed are provided for insulating the electrode layers from either of the side electrodes. The insulating regions 106 do not expand or contract even when a voltage is applied to the multilayered structure 100. On this account, there is a problem that stress is concentrated on the part and the part becomes easy to break.

A multilayered structure shown in FIG. 12 is known as one using another interconnecting method in the multilayered structure. The multilayered structure 200 shown in FIG. 12 has plural piezoelectric material layers 201, plural internal electrode layers 202, insulating films 203 formed on one end surfaces of the respective internal electrode layers 202, and two side electrodes 204 and 205. In the adjacent two internal electrode layers 202, the end surfaces on the opposite sides are covered by the insulating films 203 and the layers are insulated from either of the side electrodes 204 and 205, and thereby, a circuit equivalent to the multilayered structure 100 shown in FIG. 11 can be realized.

As shown in FIG. 12, in the multilayered structure 200, since the internal electrode layers 202 are formed over the entire surfaces of the piezoelectric material layers 201, the multilayered structure 200 is more advantageous than the multilayered structure 100 shown in FIG. 11 in expression of piezoelectric performance. Further, as described above, since the stress concentration as in the insulating regions 106 (FIG. 11) is not generated in the multilayered structure 200, the life of multilayered structure never becomes shorter.

However, in order to fabricate the multilayered structure 200, the insulating film 203 should be formed on every other end surface of the internal electrode layer 202 exposed at each side surface of the multilayered structure 200. Currently, the insulating film 203 is often formed by using brushing, printing, or photolithography technology, and there is a problem that the productivity is low according to those methods. Further, it is very difficult according to those methods to form insulating films on a two-dimensional array in which plural multilayered structures are arranged with narrow pitches. As another method, as disclosed in Japanese Patent Examined Application Publication JP-B2-61-32835, on exposed side end surfaces of internal electrode layer plates of electrostriction effect elements, the insulating layers can be formed by electrophoresis only on the exposed parts of the internal electrode layer plates and the electrostriction materials nearby. However, there is a problem that the manufacture process is restricted because opposed electrodes are required.

SUMMARY OF THE INVENTION

The present invention is achieved in view of the above-mentioned problems. An object of the present invention is to improve the productivity of a multilayered structure and a multilayered structure array by easily forming insulating films for insulating internal electrode layers from side electrodes.

In order to solve the above-mentioned problems, a multilayered structure according to one aspect of the present invention comprises a first internal electrode layer including a first conducting material extending to a first side surface region of the multilayered structure and having magnetism at a predetermined temperature and a second conducting material extending to a second side surface region different from the first side surface region of the multilayered structure and having no magnetism at the predetermined temperature; a dielectric layer formed on the first internal electrode layer; a second internal electrode layer formed on the dielectric layer and including the second conducting material extending to the first side surface region of the multilayered structure and the first conducting material extending to the second side surface region of the multilayered structure; a first insulating film formed on an end surface of the first internal electrode layer in the first side surface region of the multilayered structure; and a second insulating film formed on an end surface of the second internal electrode layer in the second side surface region of the multilayered structure.

Further, a multilayered structure array according to one aspect of the present invention has plural multilayered structures arranged in a one-dimensional manner, each of the plural multilayered structures comprising: a first internal electrode layer including a first conducting material extending to a first side surface region of the multilayered structure and having magnetism at a predetermined temperature and a second conducting material extending to a second side surface region different from the first side surface region of the multilayered structure and having no magnetism at the predetermined temperature; a dielectric layer formed on the first internal electrode layer; a second internal electrode layer formed on the dielectric layer and including the second conducting material extending to the first side surface region of the multilayered structure and the first conducting material extending to the second side surface region of the multilayered structure; a first insulating film formed on an end surface of the first internal electrode layer in the first side surface region of the multilayered structure; and a second insulating film formed on an end surface of the second internal electrode layer in the second side surface region of the multilayered structure.

Furthermore, a method of manufacturing a multilayered structure according to one aspect of the present invention comprises the steps of: (a) forming a first dielectric layer; (b) forming a first internal electrode layer including a first conducting material having magnetism at a predetermined temperature and a second conducting material having no magnetism at the predetermined temperature on the first dielectric layer; (c) forming a second dielectric layer on the first internal electrode layer; (d) forming a second internal electrode layer including the first and second conducting materials on the second dielectric layer; (e) forming grooves in a workpiece including the first dielectric layer, the first internal electrode layer, the second dielectric layer and the second internal electrode layer formed at steps (a) to (d) to produce plural structures partially connected to one another, thereby exposing the first conducting material on a first side surface region of each structure and exposing the second conducting material on a second side surface region different from the first side surface region of each structure in the first internal electrode layer, and exposing the first conducting material on the second side surface region of each structure and exposing the second conducting material on the first side surface region of each structure in the second internal electrode layer; and (f) forming a first insulating film by attaching particles having magnetism on an end surface of the first internal electrode layer in the first side surface region of each structure, and forming a second insulating film by attaching particles having magnetism on an end surface of the second internal electrode layer in the second side surface region of each structure.

According to the present invention, the internal electrode layers are formed by employing two kinds of conducting materials including a conducting material having magnetism and the insulating films are selectively formed by attaching particles having magnetism onto the end surface of the conducting material having magnetism and extending to the side surface of the multilayered structure, and therefore, the insulating film formation process can be simplified regardless of the shape and arrangement of the multilayered structure. Accordingly, the productivity can be improved significantly for the multilayered structure, a multilayered structure array in which plural multilayered structures are arranged in a one-dimensional or two-dimensional manner, and an ultrasonic probe utilizing such a multilayered structure array as ultrasonic transducers.

DESCRIPTION OF THE PREFERRED EMBODIMENTS

Figure 1:
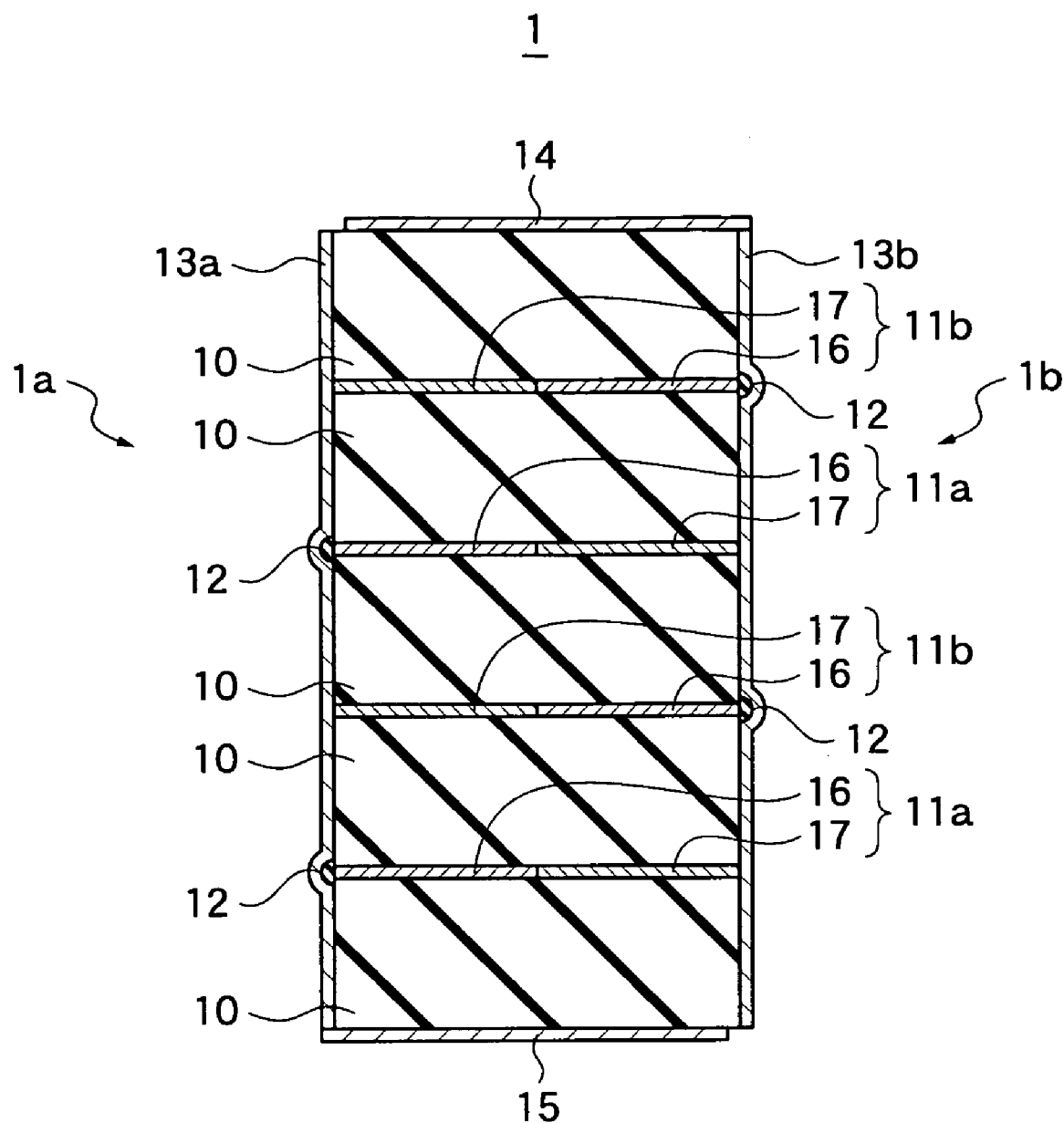
FIG. 1 is a sectional view showing a multilayered structure according to one embodiment of the present invention.

Hereinafter, the best modes for implementing the present invention will be described in detail by referring to the drawings. The same reference numerals are assigned to the same component elements and the description thereof will be omitted.

FIG. 1 is a sectional view showing a multilayered structure according to one embodiment of the present invention. This multilayered structure 1 is a columnar structure having a bottom surface with sides on the order of 0.2 mm to 1.0 mm, for example. In the embodiment, as a dielectric material, a piezoelectric material as a ferroelectric material is used. The multilayered structure 1 includes plural piezoelectric material layers 10, plural internal electrode layers 11a and 11b each containing two kinds of conducting materials, and insulating films 12 formed on one end of the respective internal electrode layers 11a and 11b. Further, the multilayered structure 1 may include two side electrodes 13a and 13b formed on the side surfaces of the stacked plural piezoelectric material layers 10. Further, the multilayered structure 1 may include an upper electrode 14 and a lower electrode 15 formed as external electrodes on upper and lower bottom surfaces of the stacked plural piezoelectric material layers 10, respectively. As shown in FIG. 1, the upper electrode 14 is connected to one side electrode 13b and the lower electrode 15 is connected to the other side electrode 13a. The shape of the bottom of the multilayered structure 1 is not limited to a square, but rectangular or other shapes may be adopted. Further, in the embodiment, the side electrodes are disposed on opposed two side surfaces 1a and 1b, however, the regions in which the side electrodes are disposed are not limited to two opposed side surfaces as long as they are electrically insulated from each other.

Each piezoelectric material layer 10 is a piezoelectric material film having a thickness on the order of 100 μm. In the embodiment, PZT (Pb(lead) zirconate titanate) as a binary solid solution containing $PbZrO_3$ and $PbTiO_3$ as principal chemical compositions is used as the piezoelectric material. Further, a ternary or above solid solution (called relaxer material) formed by adding at least one of $Pb(Mg_{1/3}Nb_{2/3})O_3$, $Pb(Ni_{1/3}Nb_{2/3})O_3$, $Pb(Zn_{1/3}Nb_{2/3})O_3$ as a third component to such a binary solid solution may be used. Alternatively, as the piezoelectric material, PLZT (lanthanum-doped lead zirconate titanate) formed by adding lanthanum oxide to PZT or a non-lead piezoelectric material such as $KNbO_3$ or bismuth series material may be used. Further, the piezoelectric material layer 10 may contain not only those principal components but also elements such as germanium (Ge), silicon (Si), lithium (Li), bismuth (Bi), boron (B), and lead (Pb), which are contained in auxiliaries used for growing crystals by heat treatment.

Each of the internal electrode layers 11a and 11b includes different two kinds of conducting materials. In the internal electrode layer 11a, a first conducting material 16 extends to the side surface 1a and a second conducting material 17 extends to the side surface 1b different from the side surface 1a. On the other hand, in the internal electrode layer 11b, a first conducting material 16 extends to the side surface 1b and a second conducting material 17 extends to the side surface 1a. Further, in the internal electrode layers 11a and 11b, the first conducting material 16 and the second conducting material 17 are disposed in contact with each other so as to be electrically connected. Such internal electrode layers 11a and 11b are alternately stacked with the piezoelectric material layers 10 in between.

On the side surfaces 1a and 1b, the end surfaces of the first conducting materials 16 are covered by the insulating films 12. Thereby, the internal electrode layers 11a are insulated from the side surface electrode 13a located on the side surface 1a, and the internal electrode layers 11b are insulated from the side surface electrode 13b located on the side surface 1b. Since the electrodes of the multilayered structure are thus formed, the stacked plural layers are electrically connected in parallel.

In such a multilayered structure 1, when a voltage is applied between the internal electrode layers 11a and 11b so that electric fields are applied to the respective piezoelectric material layers 10, the respective piezoelectric material layers 10 expand and contract by the piezoelectric effect. The multilayered structures using such piezoelectric material layers as dielectric layers are used for piezoelectric pumps, piezoelectric actuators, ultrasonic transducers for transmitting and receiving ultrasonic waves in an ultrasonic probe, or the like. Further, in the structure having the multilayered structure as described above, since areas of the opposed electrodes can be entirely made larger than that in a single layer structure and the distances between respective electrodes can be made shorter (narrower), electric impedance can be made lower. Therefore, compared to the single layer structure, the multilayered structure operates more efficiently for the applied voltage.

Next, the two kinds of the first conducting materials 16 and 17 used in the respective internal electrode layers 11a and 11b and the material of the insulating films 12 will be described in detail.

In the embodiment, the insulating films 12 for respectively insulating the internal electrode layers 11a and 11b from the side electrodes 13a and 13b are selectively formed using magnetophoresis. Here, the magnetophoresis refers to a phenomenon that particles move (migrate) in response to a formed magnetic field. On this account, an insulating material having magnetism is used as the material of the insulating films 12, a conducting material having magnetism is used as the first conducting materials 16 on which the insulating films 12 are formed and a conducting material having no magnetism is used as the second conducting materials 17 on which the insulating films 12 are not formed.

Figure 2A:
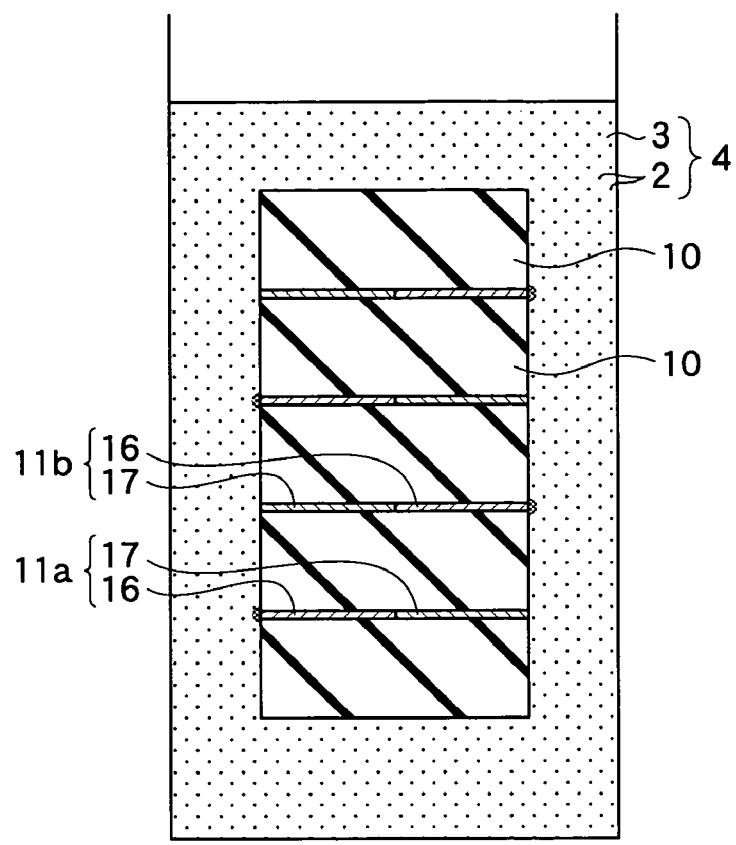
FIGS. 2A and 2B are diagrams for explanation of a principle of a method of forming insulating films shown in FIG. 1.
Figure 2B:
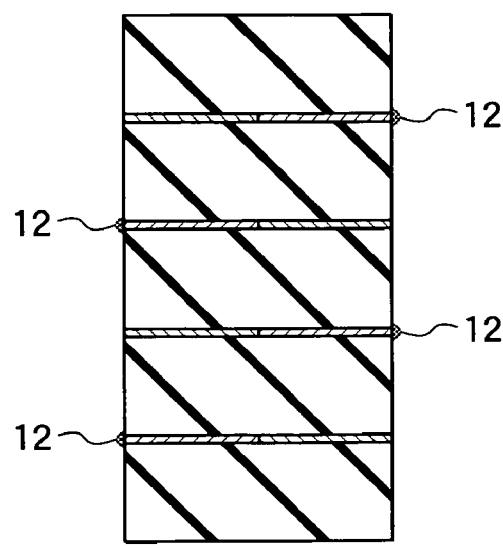

FIGS. 2A and 2B are diagrams for explanation of a principle of a method of forming insulating films by the magnetophoresis. In a container shown in FIG. 2A, a suspension 4 in which particles of an insulating material having magnetism (hereinafter, referred to as magnetic particles) 2 are dispersed in a liquid 3 is placed. As the liquid 3, in order to smoothly cause the migration, a liquid having relatively low viscosity such as water, alcohol, toluene, or xylene is desirably used.

A laminated structure including plural piezoelectric material layers 10 and internal electrode layers 11a and 11b is put into the suspension 4. As a result, the magnetic particles 2 are attracted by the first conducting materials 16 having magnetism according to the magnetic force, and adhere to the end surfaces of the first conducting materials 16. Thereby, as shown in FIG. 2B, the insulating films 12 (magnetic particles 2) can be selectively formed on one end surfaces of the respective internal electrode layers 11a and 11b.

As the first conducting material 16 (magnetic conducting material) and the magnetic particle 2 (magnetic insulating material), the following combinations (A) to (C) are conceivable.

(A) spontaneous magnetization film as the first conducting material 16 and single magnetic domain particle as the magnetic particle 2

(B) spontaneous magnetization film as the first conducting material 16 and multiple magnetic domain particle as the magnetic particle 2

(C) multiple magnetic domain film as the first conducting material 16 and single magnetic domain particle as the magnetic particle 2

In the case of using the combination (A), the magnetic particle 2 can be attached to the first conducting material 16 relatively strongly. Further, in the case of using the combination (B), the handling of the magnetic particles 2 when the suspension 4 is prepared is easy, and the power of migration is high and practical. Furthermore, in the case of using the combination (C), the step of placing the first conducting material 16 on the piezoelectric material layer 10 can be simplified. When the materials are determined, an appropriate combination may be selected in consideration of the size and shape of multilayered structure, the compatibility with the raw material of piezoelectric material layer, the manufacturing facility, or the like.

As the first conducting material 16, transition metal such as manganese (Mn), iron (Fe), cobalt (Co), and nickel (Ni) and a material containing them, or rare earth such as neodium (Nd) and samarium (Sm) and a material containing them is used. Specifically, iron-cobalt (permendur) alloy, samarium-cobalt alloy, neodium-iron-boron alloy, tungsten steel, or the like can be cited. Further, as the second conducting material 17, for example, gold (Au), platinum (Pt), or the like may be used. Furthermore, as the magnetic particle 2, ferrite magnetic material such as $BaO.6Fe_2O_3$ and $SrO.6Fe_2O_2$ or hematite $(Fe_2O_3)$ oxide may be used.

The suspension 4 containing the magnetic particles 2 and the liquid 3 is prepared in the following manner, for example. As below, the case where Ba ferrite particles are used as the magnetic particles 2 will be described. First, barium carbonate and iron oxide as raw materials are mixed and mutually dispersed, preliminarily baked, and ferritized by solid-phase reaction. The ferritized material is ground and fined into particles in submicron size. Here, it is desirable that the particle diameter of the magnetic particles is made as small as possible so as to evenly cover the end surfaces of the internal electrode layers 11a and 11b. Further, in the case where the single magnetic domain particle is used as the magnetic particle 2 (the above combination (A) or (C)), the particle diameter is required to be less than the single magnetic domain critical diameter (about 1 μm or less for Ba ferrite).

Then, the fined Ba ferrite particles are surface treated using a surface active agent such as oleic acid and dispersed in an organic solvent such as xylene. The reason particles are surface treated is that the finer the particles, the easier they aggregate because they tend to be stabilized by reducing surface energy. Further, in the single magnetic domained particles, the reason is that the particles exert attraction force to one another. Since the above mentioned oleic acid has a carboxyl group that is easily absorbed by ferrite and a hydrocarbon chain that exhibits hydrophobicity, the Ba ferrite particles can be widely dispersed in the liquid (xylene) 3 in thus prepared suspension 4. Further, in the case where water or alcohol is used as the liquid 3, gluconic acid having a carboxyl group and multiple alcohol that exhibits hydrophilicity may be used as a dispersing agent (surface treatment agent).

Furthermore, when the suspension 4 is prepared, a material having adhesiveness may be mixed in the magnetic particles 2 or the liquid 3. Thereby, the adhesive capability of the magnetic particles can be made higher. Further, when various treatments (e.g., the treatment for making magnetic particles to have insulation or the like) is performed after the magnetic particles are attached to the end surfaces of the internal electrode layers by magnetophoresis, sometimes the magnetism is lost due to change in composition of magnetic particles. However, even in such a case, the separation of insulating films can be prevented using an adhesive agent. In the case where an adhesive material is mixed in the magnetic particle 2, an adhesive layer or adhesive plaque is formed by dusting an adhesive material insoluble in the liquid 3 over the exterior of the magnetic particles. For example, when water is used as the liquid 3, an acrylic adhesive agent or vinyl acetate adhesive agent is used as the adhesive material. Further, in the case where an adhesive material is mixed in the liquid 3, an adhesive solute such as an acrylic adhesive agent or vinyl acetate adhesive agent is dispersed in the liquid 3 (generally called "emulsion adhesive agent"). In this case, it is necessary to sufficiently dilute the adhesive material such that it may not interfere with the movement of magnetic particles.

Next, a method of manufacturing the multilayered structure according to the first embodiment of the present invention will be described by referring to FIGS. 3A to 5C.

Figure 3A:
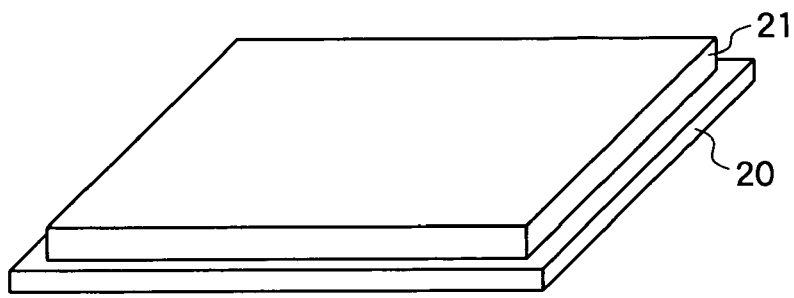
FIGS. 3A to 3D are diagrams for explanation of a method of manufacturing a multilayered structure according to a first embodiment of the present invention.

First, as shown in FIG. 3A, a piezoelectric material layer 21 having a thickness of about 100 μm, for example, is formed on a substrate 20. In this regard, in the embodiment, the aerosol deposition (AD) method is used. The AD method is a deposition method of spraying a material powder on a foundation layer at a high speed and deposited thereon, and also referred to as a gas deposition method, jet printing system, or injection deposition method.

Figure 6:
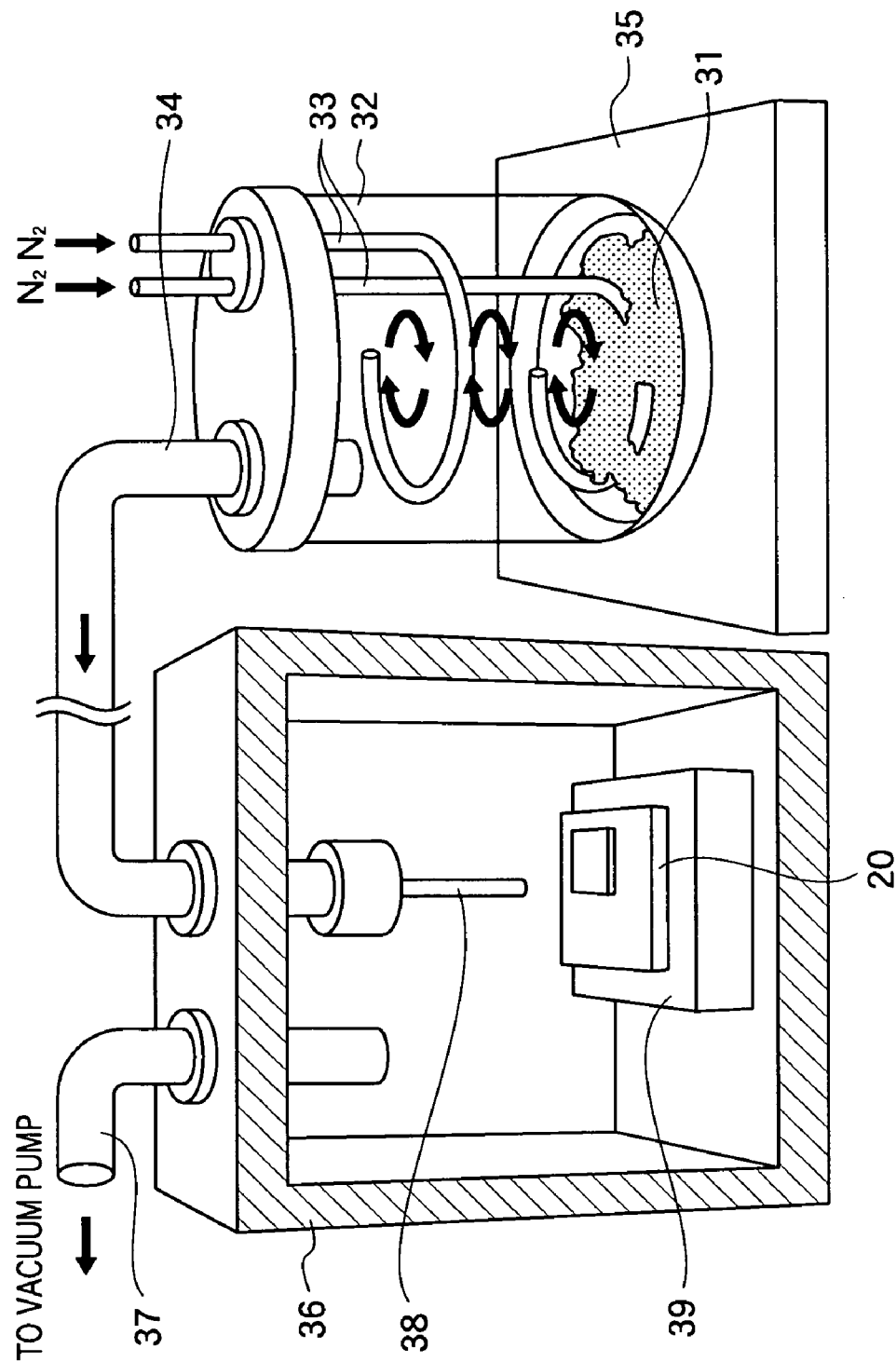
FIG. 6 is a schematic diagram showing a film forming device using an aerosol deposition method.

FIG. 6 is a schematic diagram showing a film forming device by the AD method. This film forming device has an aerosol generating container 32 in which a raw material powder 31 is placed. Here, an aerosol refers to fine particles of a solid or liquid floating in a gas. In the aerosol generating container 32, a carrier gas lead-in part 33, an aerosol lead-out part 34, and a vibrating part 35 are provided. The carrier gas lead-in part 33 introduces a carrier gas such as a nitrogen gas $(N_2)$, and thereby, the raw material powder placed in the aerosol generating container 32 is blown up to generate the aerosol. Simultaneously, the vibrating part 35 applies vibration to the aerosol generating container 32, and thereby, the raw material powder is agitated and the aerosol is efficiently generated. The generated aerosol is guided to a film forming chamber 36 through the aerosol lead-out part 34.

In the film forming chamber 36, an exhaust pipe 37, a nozzle 38, and a movable stage 39 are provided. The exhaust pipe 37 is connected to a vacuum pump and exhausts air from the film forming chamber 36. The nozzle 38 sprays the aerosol generated in the aerosol generating container 32 and introduced through the aerosol lead-in part 34 into the film forming chamber 36 toward the substrate 20. The substrate 20 is mounted on the movable stage 39 which is movable in a three-dimensional manner, and the relative position between the substrate 20 and the nozzle 38 is adjusted by controlling the movable stage 39. The particles (raw material powder) injected from the nozzle 38 and accelerated to a high speed with high kinetic energy collide against the substrate 20 are deposited thereon. It is thought that, at this time, the chemical reaction called mechanochemical reaction is caused by the collision energy of particles, and the particles are strongly attached to the substrate or previously formed films by the reaction. As the substrate 20, glass, quartz, ceramics such as PZT, metal such as SUS may be used, and glass is used in the embodiment.

As the raw material 31, for example, a PZT monocrystal powder having an average particle diameter of 0.3 μm is mixed in auxiliaries such as germanium, silicon, lithium, bismuth, boron, and lead used for growing crystals by heat treatment according to need and placed within the aerosol generating container 32 shown in FIG. 6, and the film forming device is driven. Thereby, the piezoelectric material layer 21 as shown in FIG. 3A is formed on the substrate 20.

Figure 3B:
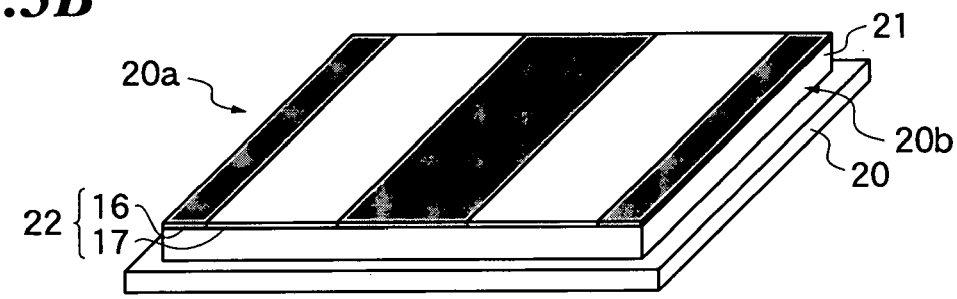

Then, as shown in FIG. 3B, an electrode layer 22 is formed by alternately disposing the first conducting materials 16 and the second conducting materials 17 in band forms on the piezoelectric material layer 21. The thickness of the electrode layer 22 is desirably 200 nm or more, and more preferably, 300 nm or more. The reason is that, in the case where the piezoelectric material layer is formed by the AD method on the electrode layer 22, because a phenomenon called anchoring that the raw material powder cuts into the foundation layer occurs when the powder is sprayed on the foundation layer, considering the typical depth of anchoring on the order of 10 nm to 300 nm, the thickness at the above degree is required such that it may function as an electrode layer.

In the embodiment, first, films of the first conducting materials 16 are formed by performing sputtering in the magnetic field using a metal mask in which slit-like openings have been formed at substantially equal widths and intervals to the width of the multilayered structure 1. Then, films of the second conducting materials 17 are formed by performing sputtering or vacuum deposition using the metal mask after shifting the substrate 20 by a distance substantially equal to the width of the multilayered structure 1. By the way, as shown in FIG. 3B, the widths of the first conducting materials 16 and the second conducting materials 17 may be made narrower than the width of the multilayered structure 1 at both ends of the electrode layer 22. Here, in order to form a spontaneous magnetization film is formed as the first conducting material, not only the above-mentioned magnetic orientation film formation, but epitaxial growth utilizing crystal magnetic anisotropy and shape magnetic anisotropy may be performed.

Figure 3C:
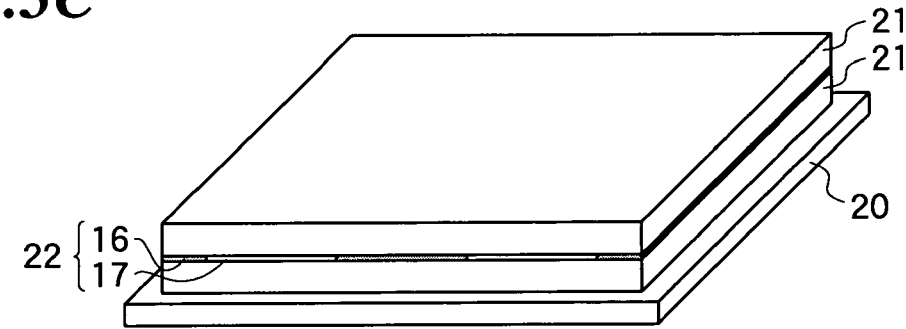

Then, as shown in FIG. 3C, the piezoelectric material layer 21 is formed using AD method on the electrode layer 22.

Figure 3D:
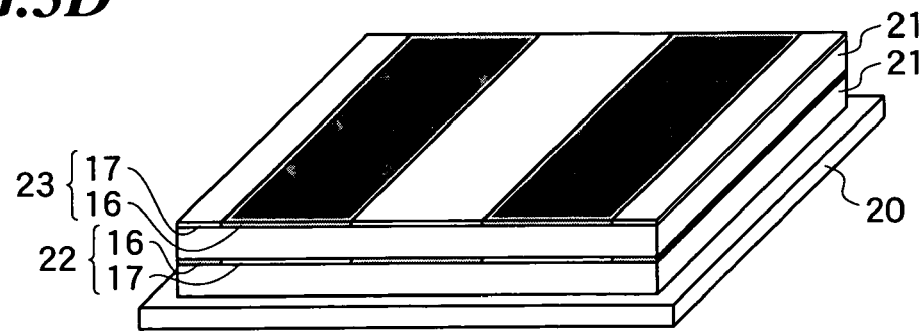

Then, as shown in FIG. 3D, an electrode layer 23 is formed by alternately disposing the first conducting materials 16 and the second conducting materials 17 in band forms on the piezoelectric material layer 21. In this regard, the locational relationship between the first conducting materials 16 and the second conducting materials 17 is made opposite to the locational relationship between them in the electrode layer 22. The method of forming the first conducting materials 16 and the second conducting materials 17 is the same as that in the electrode layer 22. The thickness of the electrode layer 23 is desirably 200 nm or more, and more preferably, 300 nm or more as is the case of the electrode layer 22.

Figure 4A:
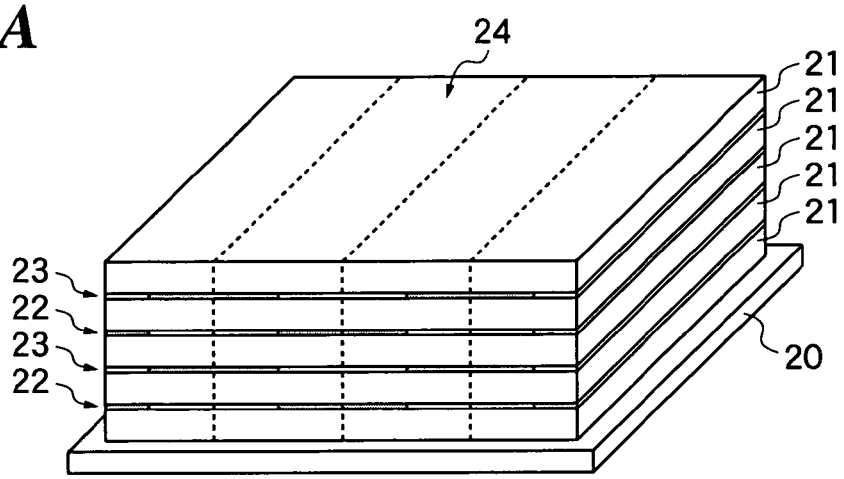
FIGS. 4A to 4C are diagrams for explanation of the method of manufacturing the multilayered structure according to the first embodiment of the present invention.

Furthermore, the steps shown in FIGS. 3A to 3D are repeated at required times, and thereby, a workpiece 24 shown in FIG. 4A is formed. Subsequently, a heat treatment step of the workpiece 24 at a predetermined temperature (e.g., 500° C. to 1000° C.) may be provided in order to improve the piezoelectric performance by enlarging grain size of PZT contained in the piezoelectric material layer.

Figure 4B:
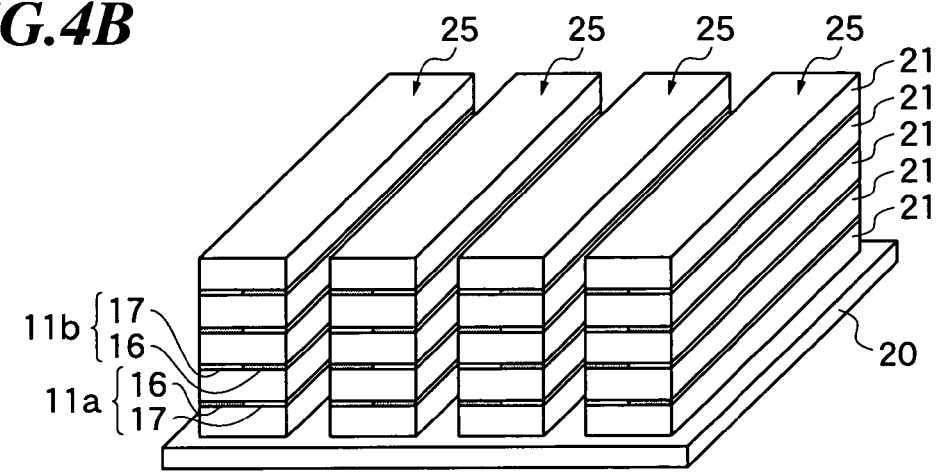

Then, as shown by broken lines in FIG. 4A, the workpiece 24 is separated into plural rectangular structures, which are connected to one another by the substrate 20, by dicing the piece at the substantially central parts of the first conducting materials 16 and substantially central part of the second conducting materials 17 in the longitudinal direction of the conducting materials. As shown in FIG. 4B, in the respective structures 25, the locational relationships between the first conducting materials 16 and the second conducting materials 17 in the internal electrode 11a and the internal electrode 11b are opposite to each other. At the time of dicing, the contour of the workpiece 24 may be shaped such that the end surfaces of the first conducting materials 16 and the second conducting materials 17 may be positively exposed on the side surfaces of the workpiece 24.

Figure 4C:
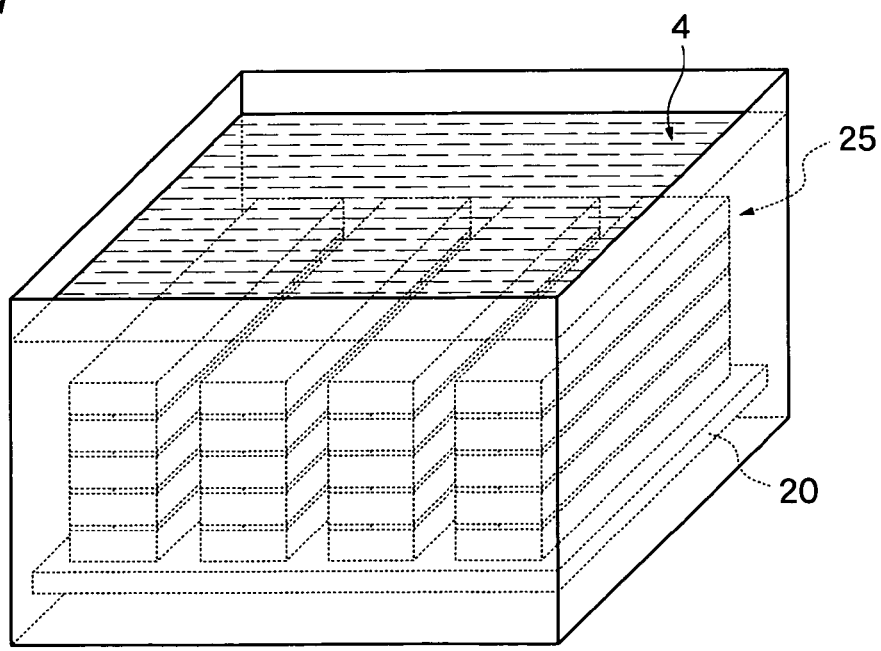
Figure 5A:
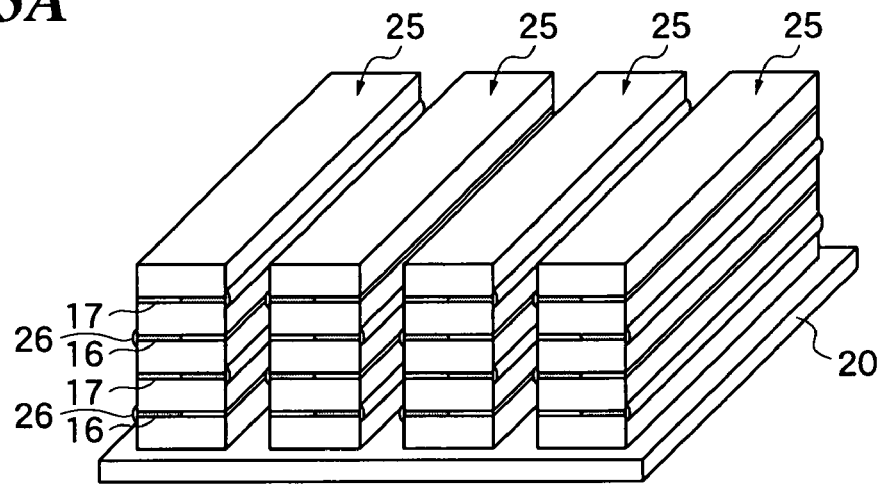
FIGS. 5A to 5C are diagrams for explanation of the method of manufacturing the multilayered structure according to the first embodiment of the present invention.

Then, as shown in FIG. 4C, the plural structures 25 are immersed in the suspension 4 in which magnetic particles (e.g., $BaO \cdot 6Fe_2O_3$) are dispersed in a liquid. Thereby, as shown in FIG. 5A, magnetic particles adhere to the end surfaces of the first conducting materials 16 exposed on the side surfaces of the respective structures 25 by magnetophoresis and insulating films 26 are formed.

Figure 5B:
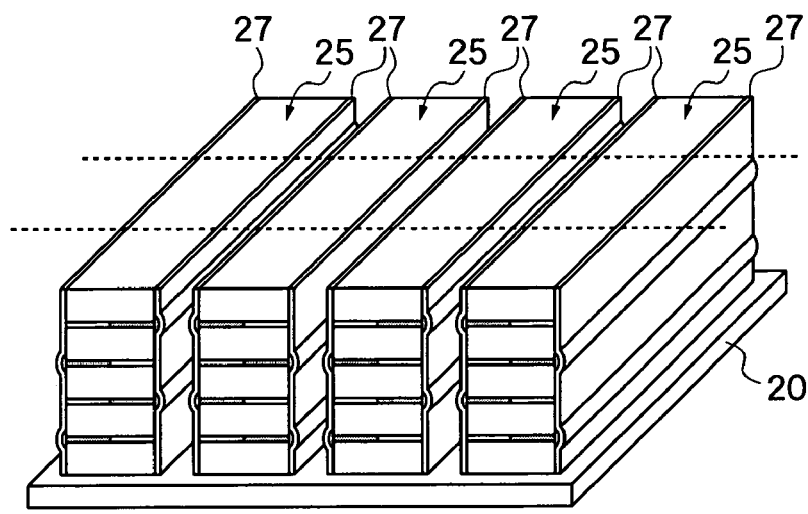

Then, as shown in FIG. 5B, side electrodes 27 are formed on the side surfaces of the structures 25 on which the insulating films 26 have been formed. For this purpose, for example, electroless platinum (Pt) plating is performed on the structures 25 and the plated layers attached to the top surfaces of the structures 25 and surfaces on which no insulating film 26 has been formed (surfaces at the front side and the opposite side in the drawing) are removed by grinding. Regarding the top surfaces of the structures 25, the plated layers may be used as upper electrodes by insulating the plated layers from side electrodes at the other side by dicing.

Figure 5C:
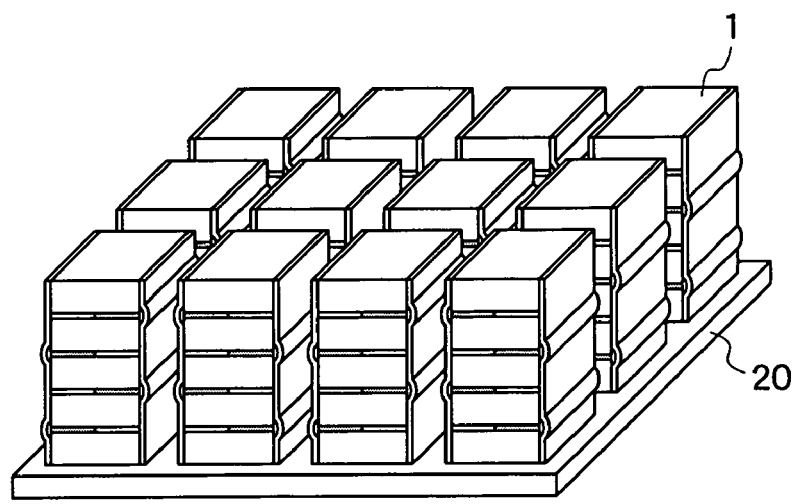

The substrate 20 is removed by grinding or peeling from the plural structures 25 on which the side electrodes 27 have been formed, and thus mutually separated plural structures 25 can be utilized as rectangular multilayered structures. Alternatively, as shown by broken lines in FIG. 5B, by dicing the structures 25 to the depth of the substrate 20 in a direction in which the longitudinal sides of the structures 25 are divided, the structures 25 are separated into plural multilayered structures and the substrate 20 is removed by grinding or peeling. Thereby, as shown in FIG. 5C, plural multilayered structures 1 can be obtained. In the embodiment, dicing has been performed with respect to the direction perpendicular to the longitudinal sides of the rectangular shapes, however, the direction may not be the perpendicular direction as long as each multilayered structure after separation includes two side electrodes.

In the above-mentioned embodiment, the piezoelectric material layer has been formed using the AD method, however, the multilayered structures having the same shapes can be fabricated by stacking PZT plate materials on which the first conducting materials and the second conducting materials have been arranged or stacking the PZT thick films and electrode layers including the first conducting materials and the second conducting materials using other methods than the AD method (e.g., green sheet method).

Further, a single multilayered structure may be fabricated by forming insulating films 26 on the side surfaces of the workpiece 24, not by separating the workpiece 24 that has been obtained by stacking the piezoelectric material layers 21, the electrode layers 22, and the electrode layers 23 into plural multilayered structures. In this case, those electrode materials are arranged in the respective electrode layers 22 and 23 such that the first conducting materials 16 and the second conducting materials 17 extend to the predetermined side surface regions in the multilayered structure.

Next, a method of manufacturing a multilayered structure array according to one embodiment of the present invention will be described by referring to FIGS. 3A to 8B. This multilayered structure array includes plural multilayered structures 1 shown in FIG. 1 and can be used as an ultrasonic transducer array, for example.

As has been previously described using FIGS. 3A to 4C, the workpiece 24 in which the electrode layers 22, the piezoelectric material layers 21, and the electrode layers 23 have been stacked is fabricated and plural multilayered structures 25 are fabricated in which the insulating films 26 shown in FIG. 5A have been formed by performing dicing and magnetophoresis. In this regard, the width of dicing is made substantially equal to the element interval (e.g., about 50 μm) of the multilayered structure array to be fabricated.

Figure 7A:
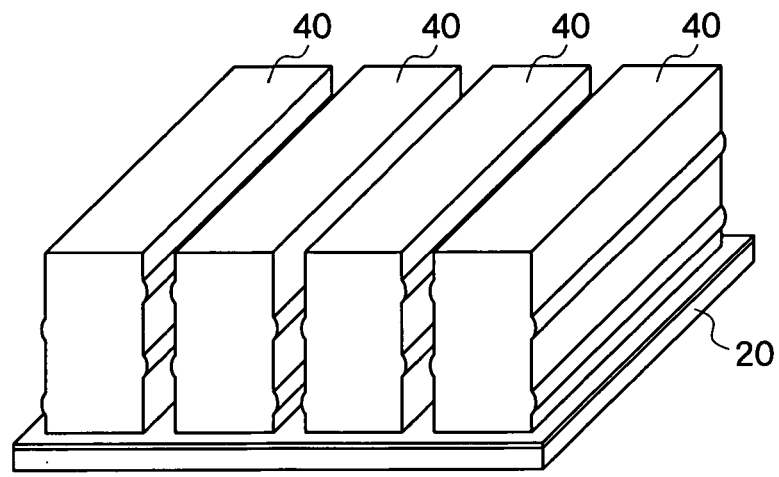
FIGS. 7A to 7C are diagrams for explanation of a method of manufacturing a multilayered structure array according to one embodiment of the present invention.
Figure 7B:
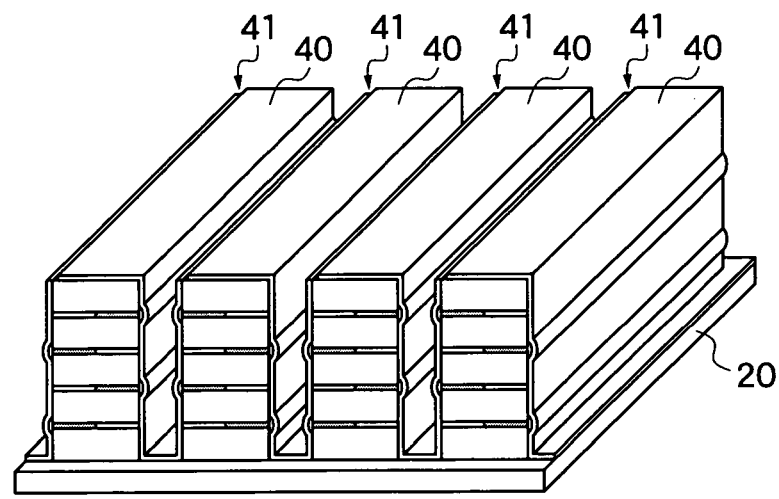

Then, as shown in FIG. 7A, the side electrodes and upper electrodes (platinum films 40) are formed. For this purpose, first, platinum films 40 are formed around the structures 25 by performing electroless platinum plating on the plural structures 25. Then, as shown in FIG. 7B, the platinum layers formed on the side surfaces of the structures 25 on which no insulating film 26 has been formed (surfaces at the front side and the opposite side in the drawing) are removed by grinding. Further, insulating regions 41 are formed by dicing along sides formed with one surfaces on which the insulating films 26 have been formed and removing parts of the platinum films 40 that have been formed on the top surfaces of the multilayered structures 25. The platinum films 40 left thereby are used as two side electrodes and used as upper electrodes connected to one side electrode and insulated from the other side electrode.

Then, the structures 25 on which the upper electrodes and the side electrodes have been formed are separated by dicing into plural multilayered structures connected to one another by the substrate 20. The width of dicing is also made substantially equal to the element interval (e.g., about 50 µm) of the multilayered structure array to be fabricated. Furthermore, in the grooves formed between the plural multilayered structures by dicing and regions except for the surrounding upper electrodes 42, a liquid epoxy resin 43 as a filling material is injected and cured. As the filling material, urethane resin, silicone rubber, or the like may be used other than that.

Figure 7C:
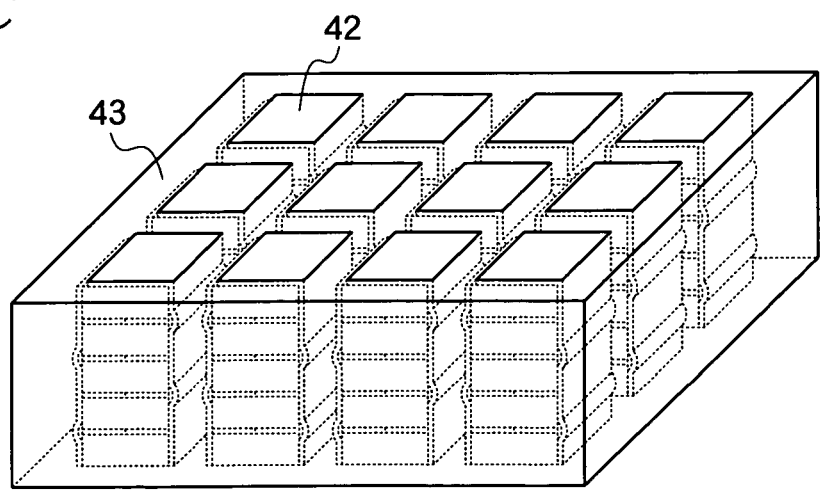

Furthermore, a multilayered structure array shown in FIG. 7C is formed by removing the substrate 20 by grinding or peeling. In the multilayered structure array, end surfaces of the piezoelectric material layers and side electrodes of the respective multilayered structures are exposed on the bottom surface of the epoxy resin 43.

Figure 8A:
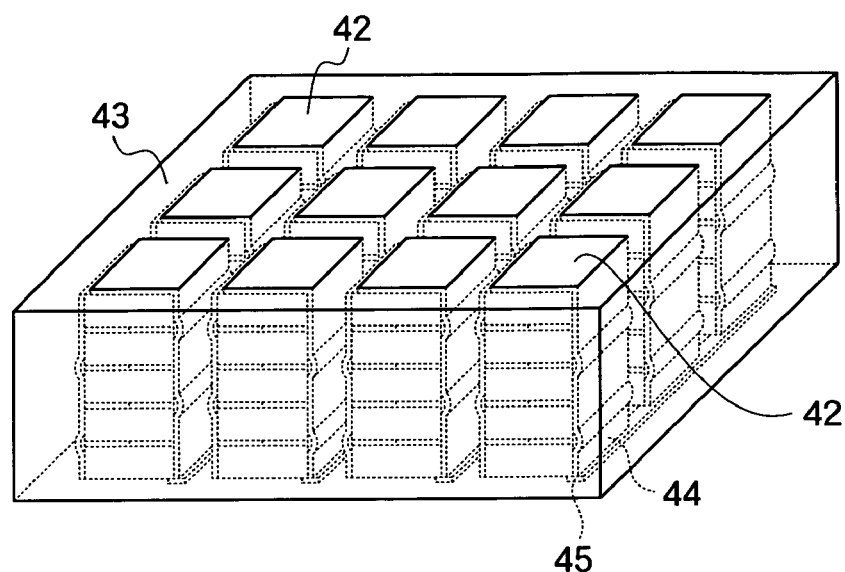
FIGS. 8A and 8B are diagrams for explanation of the method of manufacturing the multilayered structure array according to the one embodiment of the present invention.

Then, as shown in FIG. 8A, insulating films 45 are formed at the bottom surface of the epoxy resin 43 (lower side in the drawing) so as to cover the end surfaces of the side electrodes 44 at the side where they are connected to the upper electrodes 42. For this purpose, for example, silicon oxide films may be formed by sputtering using a metal mask, for example. The insulating films 45 are for insulating the side electrodes 44 from a common electrode, which will be formed later, and may be formed continuously between elements having side electrodes to be insulated within the same plane.

Figure 8B:
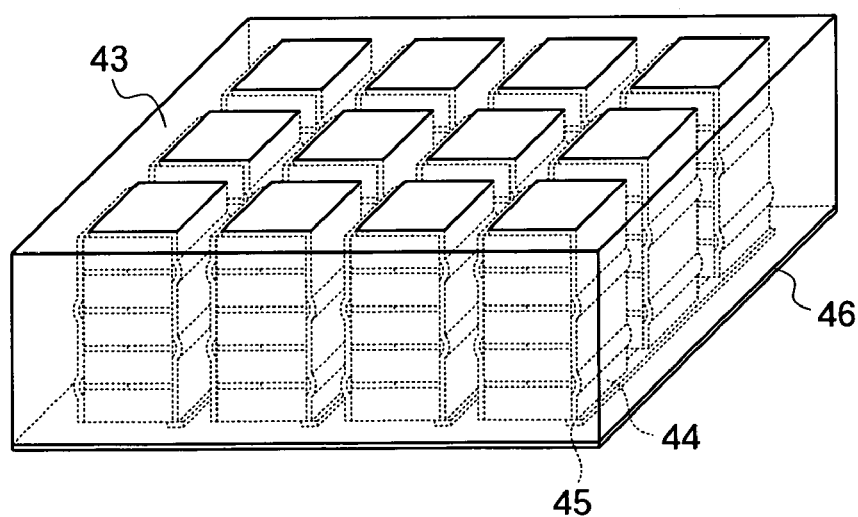

Furthermore, as shown in FIG. 8B, a common electrode 46 is formed by forming a film of gold (Au) by sputtering, for example, at the bottom surface of the epoxy resin 43. In this regard, the regions of the insulating films 45 may be excluded from the film forming region using a metal mask.

Thus, a multilayered structure array (1-3 composite) 50 including plural multilayered structures 1 (FIG. 1) arranged in a two-dimensional manner can be manufactured.

Figure 9:
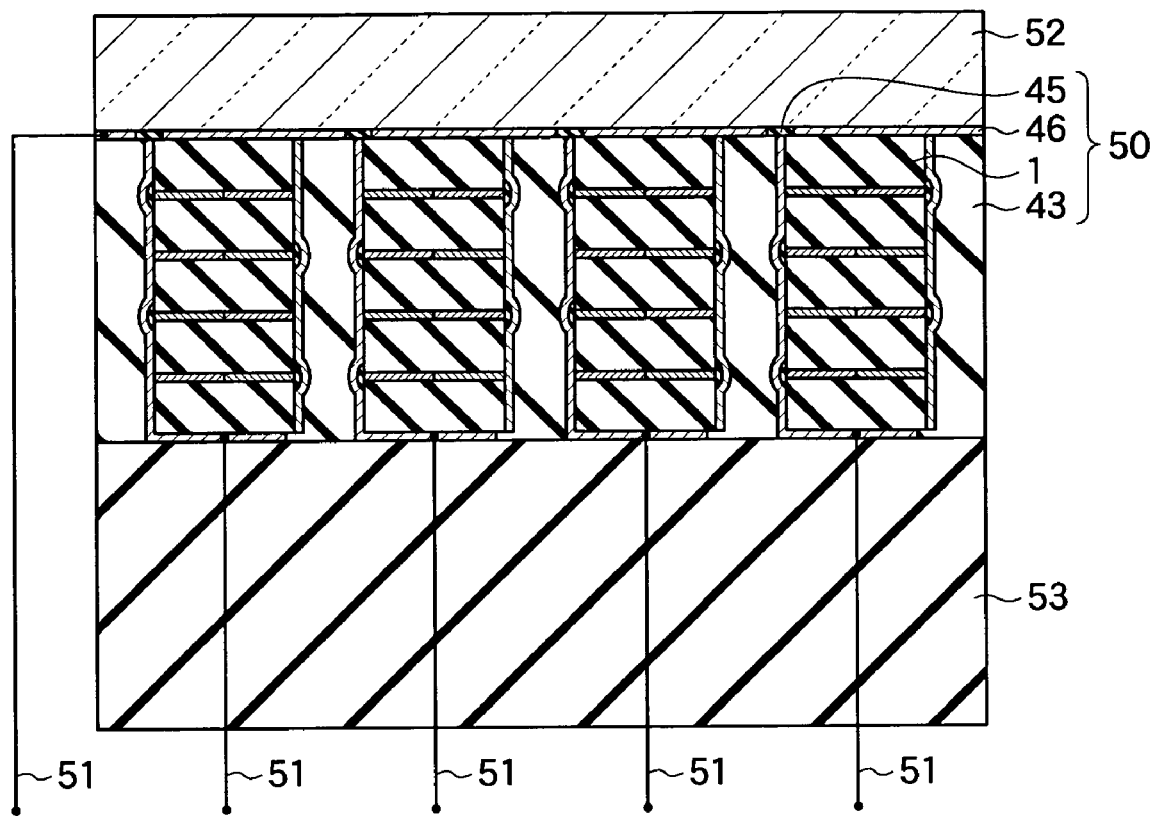
FIG. 9 is a sectional view showing a structure of an ultrasonic probe using the multilayered structure array according to the one embodiment of the present invention.

Further, as shown in FIG. 9, an ultrasonic probe can be fabricated by drawing interconnections 51 from the multilayered structure array 50, disposing an acoustic matching layer 52 of Pyrex glass or the like on one bottom surface (e.g., the common electrode 46 side) of the multilayered structure array 50, disposing a backing material 53 of epoxy resin containing metal powder or the like on the other bottom surface, and accommodating them in a casing.

Alternatively, as shown in FIG. 7B, after the upper electrodes and the side electrodes are formed on the plural structures 25, the filling material is disposed in between, the substrate 20 is removed, and further, lower electrodes may be formed. Thereby, a multilayered structure array in which plural rectangular multilayered structures 1 are arranged in a one-dimensional manner can be fabricated.

In the above-mentioned embodiment, since the machining such as dicing is performed in a condition in which the workpiece 24 is fixed to the substrate 20, even when the work piece 24 and the structures 25 are cut to the depth of the substrate, the arrangement of multilayered structures in the finished product can be held (see FIG. 4B). However, as is the case where the piezoelectric material layers are heat treated, sometimes the substrate 20 is required to be removed in advance because of process constraints. In this case, the lowermost piezoelectric material layer is formed thicker than the piezoelectric material layers in the finished product in advance and, when the workpiece 24 and the structures 25 are diced, grooves are formed to the depth at which the lowermost piezoelectric material layer is not completely cut. The plural multilayered structures may be separated from one another by disposing the filling material between the plural multilayered structures that are partially connected, and then, grinding the lowermost piezoelectric material layer.

Figure 10A:
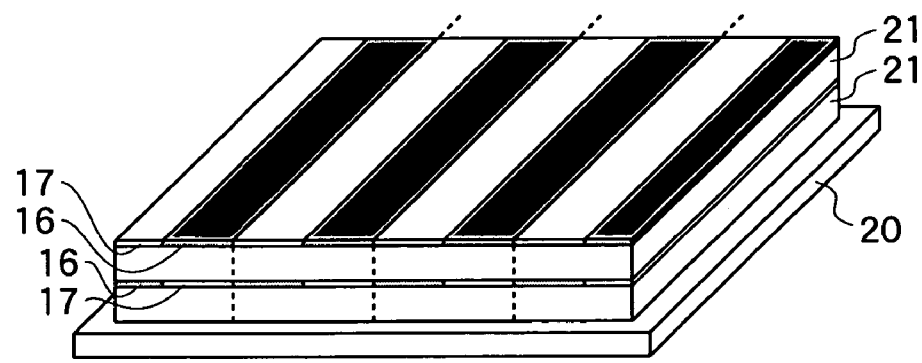
FIGS. 10A and 10B are diagrams for explanation of another method of manufacturing the multilayered structure array according to the one embodiment of the present invention.
Figure 10B:
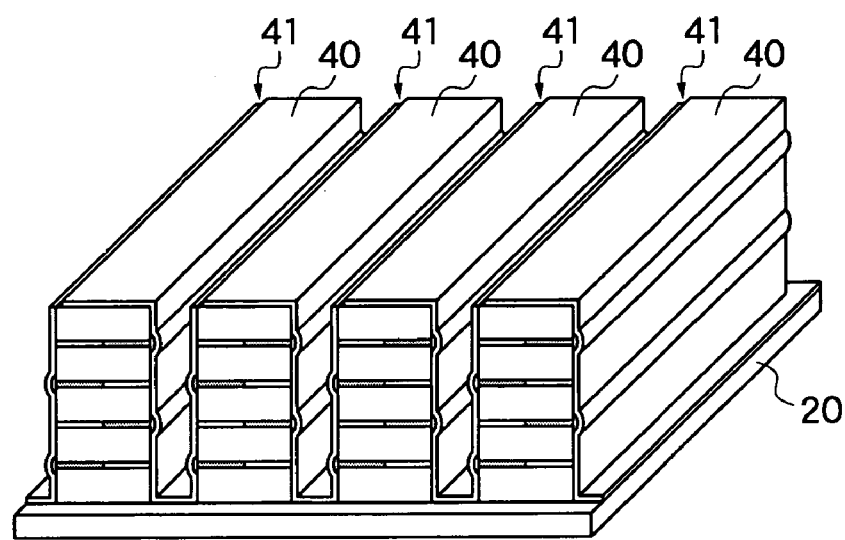
Figure 11:
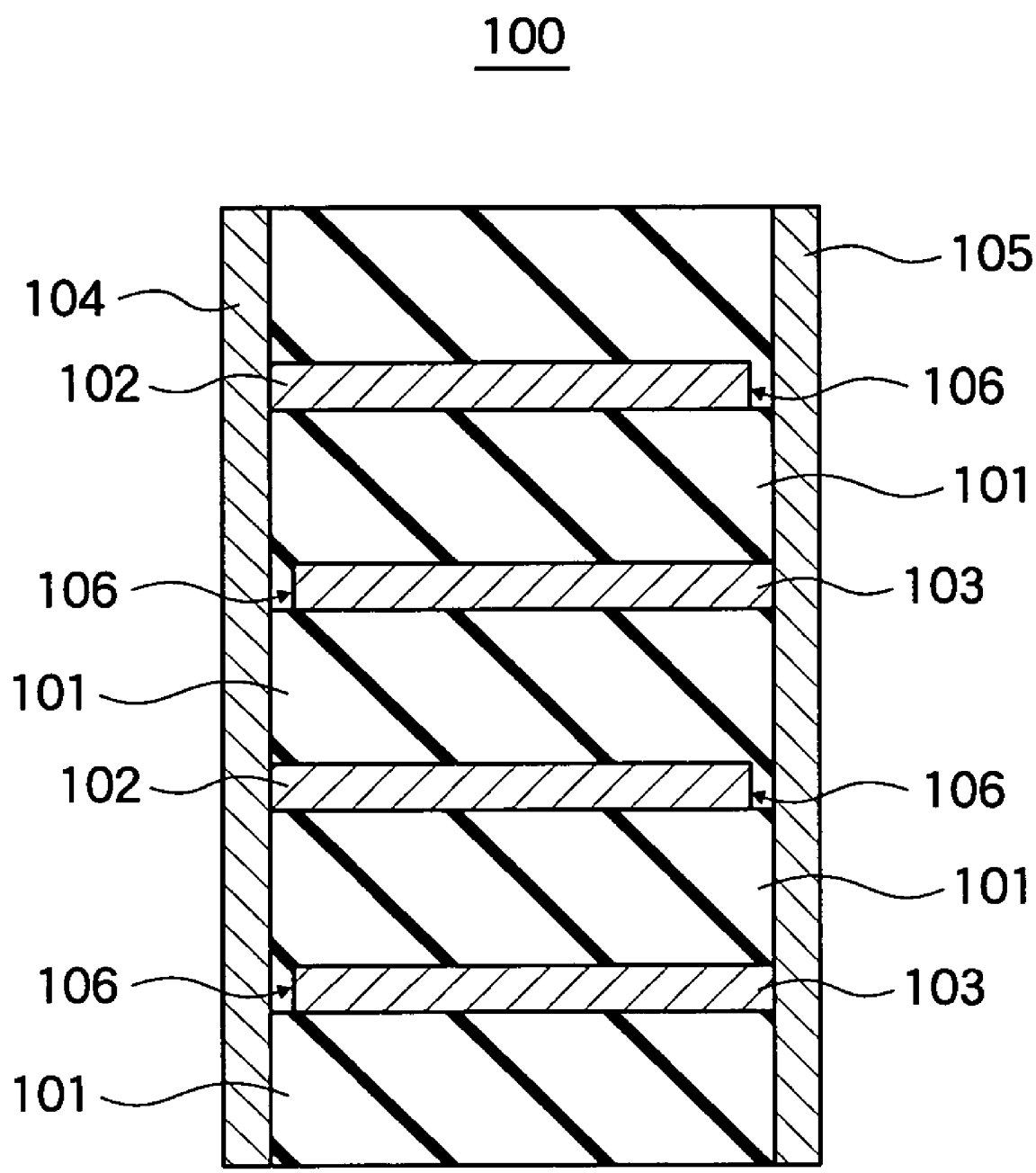
FIG. 11 is a diagram for explanation of an interconnection method in a conventional multilayered structure.
Figure 12:
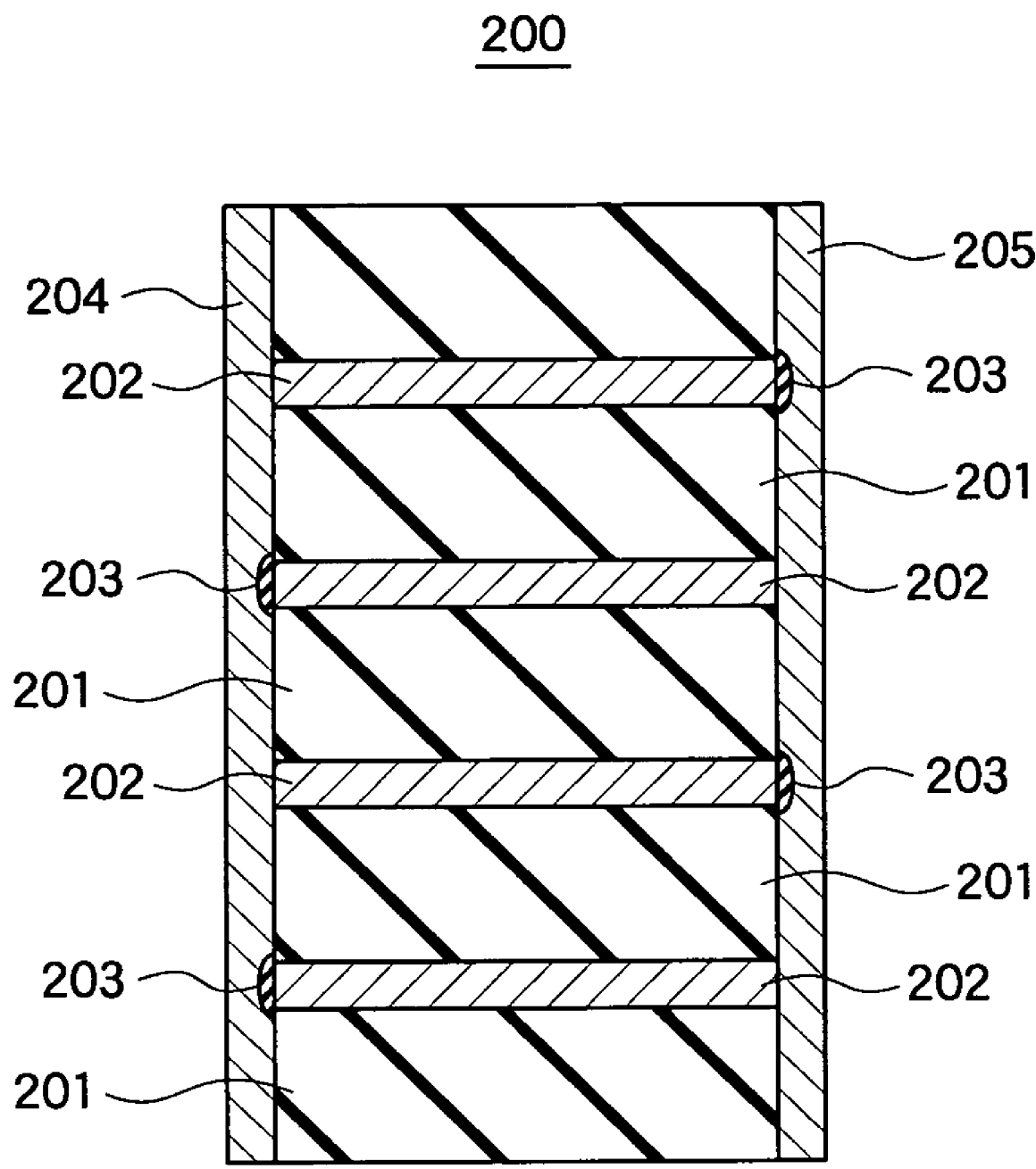
FIG. 12 is a diagram for explanation of another interconnection method in the conventional multilayered structure.

Next, a modified example of the method of manufacturing a multilayered structure array according to the embodiment will be described. In this modified example, as shown in FIG. 10A, two kinds of the first and second conducting materials 16 and 17 are arranged in band forms such that the boundary positions between the first conducting materials 16 and the second conducting materials 17 may overlap between different electrode layers. When the multilayered structure including plural piezoelectric material layers and plural electrode layers is separated into plural multilayered structures, dicing is performed at those boundaries (broken lines in FIG. 10A). Thereby, as shown in FIG. 10B, since the insulating films are formed in a staggered manner on two side surfaces opposed with grooves in between, the plural multilayered structures can be arranged with narrower pitches.

The arrangement of the two kinds of conducting materials that form the internal electrode layers are not necessarily band forms as shown in FIGS. 3B, 3D, and 10A, but an arbitrary arrangement may be adopted in accordance to the shape (e.g., cylindrical shape) or arrangement (e.g., concentric or random arrangement) of multilayered structures to be fabricated. That is, it is essential only that the conducting materials having magnetism be disposed at the side surface side where the insulating films are formed. In this case, two kinds of patterns of conducting materials can be formed using a metal mask. Further, the multilayered structures may be shaped or separated so as to be in arbitrary shapes or arrangement using the sandblasting method.

Next, a method of manufacturing the multilayered structure according to the second embodiment of the present invention will be described.

In the embodiment, as the first conducting material 16 and the second conducting material 17 that form the internal electrode layers, metals or alloys both having magnetism at normal temperature but having different Curie points are used. That is, multilayered structures 25 shown in FIG. 4B are fabricated by employing a material "A" having Curie point $T_{CA}$ as the first conducting materials 16 on which the insulating films 12 are formed, and a material "B" having Curie point $T_{CB}$ ($T_{CB}<T_{CA}$) as the second conducting materials 17 on which no insulating film 12 is formed. When magnetophoresis is performed, the temperature of the liquid in which magnetic particles have been dispersed is held at a temperature T between $T_{CA}$ and $T_{CB}$ ($T_{CB}<T<T_{CA}$). Thereby, since the spontaneous magnetization of the material "B" becomes zero, the magnetic particles do not adhere to the end surfaces of the material "B", and insulating films can be selectively formed only on the end surfaces of the material "A". As the combination of material A and material B, for example, permendur (Curie point 980° C.) and nickel (Curie point 354° C.) may be used.

Thus, by controlling the expression of magnetism with temperature, the range of choice of materials that can be used as conducting materials can be expanded. Further, the expression of magnetism may be controlled not only with Curie point, but also with structural phase transition temperature or glass transition point.

Next, a method of manufacturing the multilayered structure according to the third embodiment of the present invention will be described.

In the embodiment, in order to insulate the internal electrode layers from the side electrodes, the insulating films 12 (FIG. 1) are formed by attaching the magnetic particles having conductivity to the end surfaces of the internal electrode layers by magnetophoresis, and then, oxidizing those magnetic particles. For this purpose, in the embodiment, magnetophoresis (FIGS. 2A and 2B) is performed using an easily-oxidizable material such as iron or nickel as magnetic particles.

First, in the same manner as has been described using FIGS. 3A to 4C, plural rectangular multilayered structures 25 including plural piezoelectric material layers 21 and electrode layers 22 and 23 are fabricated. Then, as shown in FIG. 4C, the plural multilayered structures 25 are immersed in a liquid in which an iron fine powder, for example, have been dispersed, and the end surfaces of the conducting materials 16 are coated with the iron fine powder by the magnetophoresis. Then, the coated parts are oxidized by heat treating the plural coated multilayered structures 25 for 30 minutes in air at 800° C. Thereby, the insulating films 26 shown in FIG. 5A are formed.

The subsequent steps are the same as those described in the first embodiment.

Thus, according to the embodiment, since even a material having conductivity in the normal state can be used as a raw material of magnetic particles as long as the material is oxidizable by heat treatment or the like, the range of choice of materials can be expanded.

Alternatively, not only the oxidization treatment but also nitriding treatment, fluorination treatment, or sulfuration treatment may be used in order to make the coating of the magnetic particles covering the end surfaces of the internal electrode layers to have insulation. For example, in the case of using fluorination treatment, the end surfaces of the internal electrode layers are coated by magnetophoresis using nickel as magnetic particles, the coating is chloridized using hydrochloric acid, and then, fluorine is allowed to act thereon in an atmosphere at 150° C. Thereby, nickel fluoride ($NiFe_2$) having insulation can be formed.

Furthermore, as a modified example of the method of manufacturing the multilayered structure according to the embodiment, not only the above-mentioned chemical treatment, but also structure transition into quasi-crystalline structure, amorphous, martensitic transformation, or the like may be used.

Next, a method of manufacturing the multilayered structure according to the fourth embodiment of the present invention will be described.

In the embodiment, in order to insulate the internal electrode layers 11a and 11b from the side electrodes 13a and 13b shown in FIG. 1, respectively, the insulating films 12 are formed by attaching the magnetic particles 2 (FIG. 2A) to the end surfaces of the internal electrode layers by magnetophoresis, and the end surfaces of the conducting materials at the side where the insulating films have been formed are oxidized. For this purpose, as a conducting material at the side where the insulating films are formed, a magnetic material easily oxidizable at some degree is used. As such a material, for example, nickel is cited.

First, in the same manner as has been described using FIGS. 3A to 4C, plural rectangular multilayered structures 25 including plural piezoelectric material layers 21 and electrode layers 22 and 23 are fabricated using nickel as the first conducting materials 16 and using platinum as the second conducting materials 17. Then, as shown in FIG. 4C, the plural multilayered structures 25 are immersed in the suspension 4 in which a ferrite magnetic material, for example, have been dispersed in a liquid, and the insulating films 26 are formed on the end surfaces of the conducting materials 16 by the magnetophoresis. Then, the end surfaces of the conducting materials 16 (nickel) are oxidized by heat treating the plural multilayered structures 25 on which the insulating films have been formed in an oxygen atmosphere or air at about 500° C. to 1000° C. The heat treatment on the piezoelectric material layers may be simultaneously performed by controlling the temperature and time of that heat treatment.

Thus, according to the embodiment, since the end surfaces of the internal electrodes themselves are oxidized in addition to the formation of insulating films of magnetic particles on the end surfaces of the internal electrodes, the internal electrodes can be insulated from the side electrodes more reliably.

Alternatively, not only the oxidization treatment but also nitriding treatment, fluorination treatment, or sulfuration treatment may be used in order to make the end surfaces of the internal electrode layers to have insulation. For this purpose, as the conducting material (the first conducting material 16) at the side insulated from the side electrodes, a material easily nitrided, fluorinated, or sulfurated may be used and the same treatment as that described in the second embodiment may be performed.

Thus, according to the first to fourth embodiments, insulating films can be easily formed on the end surfaces of internal electrode layer using magnetophoresis. Further, unlike the case of using electrophoresis, the process of voltage application is not required, and thereby, the entire process can be simplified. Furthermore, insulating films on side surfaces can be formed regardless of arrangement or pitches of multilayered structures as a target of fabrication. Especially, even in the case where opposed electrodes for electrophoresis or photolithography are difficult to be disposed, insulating films can be easily formed according to the embodiments, and thereby, a new device or new function can be created.

The invention claimed is:

1. A method of manufacturing a multilayered structure comprising the steps of:
   (a) forming a first dielectric layer;
   (b) forming a first internal electrode layer including a first conducting material having magnetism at a predetermined temperature and a second conducting material having no magnetism at the predetermined temperature on said first dielectric layer;
   (c) forming a second dielectric layer on said first internal electrode layer;
   (d) forming a second internal electrode layer including the first and second conducting materials on said second dielectric layer;
   (e) forming grooves in a workpiece including said first dielectric layer, said first internal electrode layer, said second dielectric layer and said second internal electrode layer formed at steps (a) to (d) to produce plural structures partially connected to one another, thereby exposing the first conducting material on a first side surface region of each structure and exposing the second conducting material on a second side surface region different from the first side surface region of each structure in said first internal electrode layer, and exposing the first conducting material on the second side surface region of each structure and exposing the second conducting material on the first side surface region of each structure in said second internal electrode layer; and (f) forming a first insulating film by attaching particles having magnetism on an end surface of said first internal electrode layer in the first side surface region of each structure, and forming a second insulating film by attaching particles having magnetism on an end surface of said second internal electrode layer in the second side surface region of each structure.

2. A method according to claim 1, wherein steps (a) and (c) includes forming said first dielectric layer and forming said second dielectric layer respectively by using an aerosol deposition method of spraying a raw material powder to a foundation layer to deposit the raw material powder thereon.

3. A method according to claim 1, wherein plural sets of said first dielectric layer, said first internal electrode layer, said second dielectric layer and said second internal electrode layer are stacked by repeating steps (a) to (d).

4. A method according to claim 1, wherein step (f) includes attaching insulating particles having magnetism on the end surfaces of said first and second internal electrode layers.

5. A method according to claim 4, wherein step (f) includes immersing said workpiece in a suspension including particles having magnetism and dispersed in a liquid.

6. A method according to claim 4, wherein step (f) includes attaching conducting particles having magnetism on the end surfaces of said first and second internal electrode layers, and then, making said conducting particles have insulation by oxidization, nitriding, fluorination, or sulfuration.

7. A method according to claim 1, wherein each of steps (b) and (d) include spontaneously magnetizing said first conducting material.

8. A method according to claim 1, wherein steps (b) and (d) includes forming said first internal electrode and forming said second internal electrode respectively by employing materials having different expression temperature of magnetism from each other as said first and second conducting materials; and step (f) includes attaching said particles having magnetism at a temperature at which the magnetism of said first conducting material is expressed and the magnetism of said second conducting material is not expressed.

9. A method according to claim 1, further comprising the step of:

forming a first side electrode connected to said second internal electrode layer and insulated from said first internal electrode layer by said first insulating film on the first side surface region of each structure; and forming a second side electrode connected to said first internal electrode layer and insulated from said second internal electrode layer by said second insulating film on the second side surface region of each structure.

10. A method according to claim 1, further comprising the step of:

(g) forming grooves in each structure in a direction different from that at step (e) to produce plural sets of multilayered structures partially connected to one another after step (f).

11. A method according to claim 10, further comprising the steps of:

filling the grooves formed at steps (e) and (g) with a filling material; and removing parts with which said plural sets of multilayered structures are connected to one another after said filling material is cured.

12. A method according to claim 1, further comprising the steps of:

cutting each structure in a direction different from that at step (e) to produce plural sets of multilayered structures partially connected to one another after step (f);

separating each set of multilayered structures partially connected to one another to produce plural multilayered structures.

* * * * *